United States Patent [19]

Johannsen

[11] 4,303,932
[45] Dec. 1, 1981

[54] LATERAL TRANSISTOR FREE OF PARISITICS

[75] Inventor: Rolf Johannsen, Munich, Fed. Rep. of Germany

[73] Assignee: Siemens Aktiengesellschaft, Berlin & Munich, Fed. Rep. of Germany

[21] Appl. No.: 65,650

[22] Filed: Aug. 10, 1979

[30] Foreign Application Priority Data

Aug. 17, 1978 [DE] Fed. Rep. of Germany ....... 2835930

[51] Int. Cl.³ ..................... H01L 27/04; H01L 29/72
[52] U.S. Cl. ........................................ 357/48; 357/35; 357/86
[58] Field of Search ..................... 357/35, 36, 48, 86, 357/92, 38

[56] References Cited

U.S. PATENT DOCUMENTS

| | | | |
|---|---|---|---|
| 3,590,345 | 6/1971 | Brewer | 357/48 |
| 3,676,714 | 7/1972 | Wensink et al. | 357/86 |
| 3,878,551 | 4/1975 | Callahan Jr. | 357/48 |
| 4,070,654 | 1/1978 | Tachi | 357/92 |
| 4,117,507 | 9/1978 | Pacor | 357/86 |
| 4,156,246 | 5/1979 | Pedersen | 357/86 |

OTHER PUBLICATIONS

Lehning, IEEE J. of Solid State Circuits, vol. SC 9 No. 5 Oct. 1974, pp. 228–229.
Hamilton and Howard, Basic Integrated Circuit Engineering, (McGraw-Hill, NY 1975) p. 7.
Warner Jr. et al., "Bipolar Lock-layer Transistor," Solid-State Electronics, (Pergammon Press, London) vol. 18, 1975, p. 323.

*Primary Examiner*—William D. Larkins
*Attorney, Agent, or Firm*—Hill, Van Santen, Steadman, Chiara & Simpson

[57] ABSTRACT

For the sake of an increased operational security and a reduction of substrate currents of an intergrated semiconductor circuit with a lateral transistor and a pn insulation, a protective zone exhibiting the opposite conductivity type and contacted barrier-free together with the collector of the collector electrode is inventively provided in the collector of the lateral transistor.

12 Claims, 2 Drawing Figures

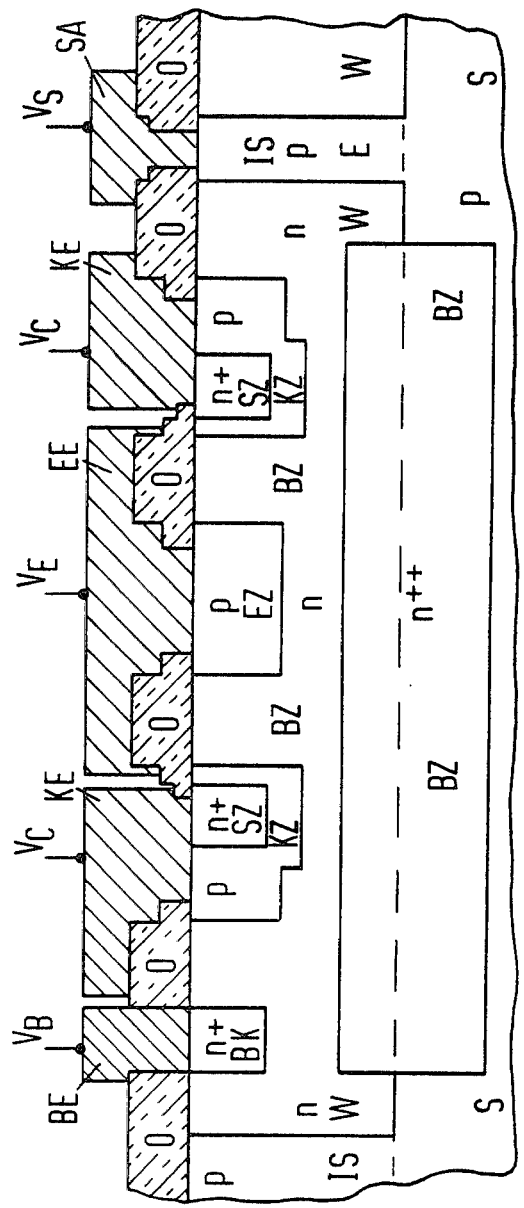
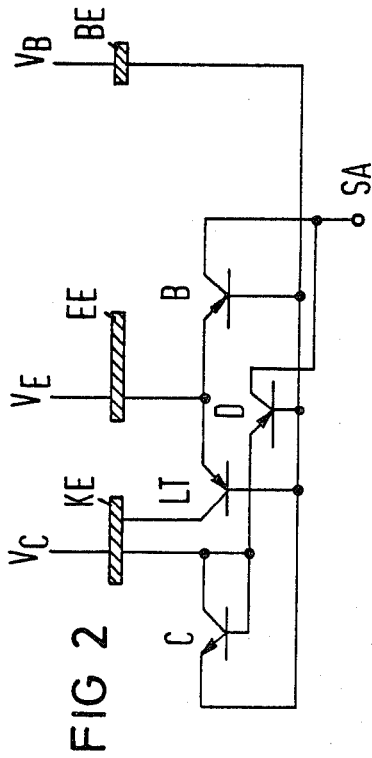
FIG 1
FIG 2

LATERAL TRANSISTOR FREE OF PARISITICS

BACKGROUND OF THE INVENTION

The invention relates to a monolithically integrated semiconductor circuit with at least one lateral transistor whose base zone exhibiting one conductivity type is delimited from its environment in the semiconductor crystal exhibiting the opposite conductivity type by means of a pn junction in the non-conducting direction via a d.c. voltage.

In order to achieve a sufficient decoupling of the semiconductor elements comprising the circuit in monolithically integrated semiconductor circuits, it is usual to form the individual semiconductor elements of the circuit—in so far as this is required,—in a respective insulation trough. The term "insulation trough," means a semiconductor area of the one conductivity type which is embedded in a semiconductor area of the opposite conductivity type upon formation of a so-called "insulating pn junction."

In the manufacture of such semiconductor devices, one proceeds from a monocrystalline semiconductor slice of the one conductivity type consisting, particularly, of silicon as the substrate on whose one surface side a monocrystalline layer of the same semiconductor material, but of the opposite conductivity type, is epitaxially deposited. By means of masked diffusion and/or implantation, an epitaxial layer is then provided with a plurality of strip-shaped insulation zones exhibiting the conductivity type of the substrate, which insulation zones receive contact over their entire length with the substrate and form an inter-connected zone of the one conductivity type together with this, in which the parts of the epitaxial layer still exhibiting the opposite conductivity type are embedded as islands which are respectively provided as an insulation trough in the monolithically integrated semiconductor circuit to be finished in the usual manner. In most cases, each insulation trough contains at least one semiconductor element, for example, a transistor. The transistor, for example, can be designed as a pnp lateral transistor whereby the emitter-base pn junction and the collector-base pn junction are arranged next to one another. The insulation trough or, respectively, the part of the insulation trough not covered by the manufacture of the emitter zone and collector zone of the lateral transistor forms the base zone of the transistor which is delimited from the area of the semiconductor crystal, above all the substrate, lying outside of the insulation trough and not belonging to the transistor by means of a pn junction which is reverse biased during operation of the integrated circuit.

However, in the use of lateral transistor structures, it is observed that they always divide their emitter current $J_E$ into a lateral active component $J_{EL}$ and a vertical parasitic component $J_{EV}$. The parasitic component $J_{EV}$ divides into a recombination component (base current) and into a second component $J_s$ which flows off into the substrate, i.e. into the area outside of the insulation trough.

On its way to the next metallic substrate contact, this substrate current generates a voltage drop with parasitic effects, for example, by changing the bias of insulating pn junctions into the forward direction, by forming thyristors, etc., and, in the extreme case, causes the destruction of the integrated circuit containing the lateral transistor.

The relationships become particularly unfavorable upon saturation operation. Namely, in the case of the design of the lateral transistor as a pnp transistor, as soon as the collector potential has dropped so far that the base-collector pn junction is forward biased, the collector in turn begins to inject into the base and becomes a second emitter whereas the substrate becomes a collector. Thus, substrate currents with the said injurious effects for the operation and the existence of the integrated semiconductor circuit again flow. Only in this case, the current gain of the parasitic pnp transistor which has arisen is considerable because of the small base width, the great emitter edge length and the lack of a screening intermediate electrode.

SUMMARY OF THE INVENTION

The object of the invention is to specify a way to alleviate this.

Therefore, a design of the monolithically integrated semiconductor circuit defined at the outset is inventively proposed such that a semiconductor zone exhibiting the conductivity type of the base zone of the lateral transistor is created within the collector zone of the lateral transistor and is contacted barrier-free by the same electrode as the collector of the lateral transistor.

The lateral transistor can be of the pnp type; however, it can also be of the npn type. In the following, the pnp type is cited as an example. The explanations are true for the npn type by analogy.

The presence of the semiconductor zone embedded in the collector zone of the lateral transistor and exhibiting the conductivity type opposite to this represents an inversely operating vertical transistor with collector-base short circuit exhibiting the inverted zone sequence with respect to the lateral transistor whose emitter is formed by the base of the lateral transistor. By so doing, the marginal conditions for the electron injection into the emitter of the lateral transistor are improved in accord with the current gain of the inverse vertical transistor. Given constant emitter current of the lateral transistor, accordingly, the hole current in the base of the lateral transistor and, accordingly, the parasitic substrate current are reduced.

THE DRAWINGS

An advantageous embodiment of a device according to the invention is illustrated in FIG. 1, whereas the equivalent circuit on which the arrangement is based is reproduced in FIG. 2.

DETAILED DESCRIPTION OF THE DRAWINGS

In the manufacture of the arrangement, as usual, one proceeds from a p-conductive substrate S consisting, particularly, of monocrystalline silicon on whose surface discrete $n^+$-doped buried layer zones BZ are formed by means of masked diffusion and/or implantation of which respectively one is allocated to each insulation trough of the integrated circuit to be manufactured. The buried layer zones preferably have a rectangular shape. The surface of the substrate S provided with the buried layer zones BZ is then provided with a n-conductive epitaxial layer E of the same semiconductor material as the substrate S which forms the basis for the manufacture of the n-conductive insulation troughs W provided for the individual semiconductor elements of the integrated circuit. The lateral delimitation of the individual insulation troughs W from one another is carried out by strip-shaped, p-conductive insulation zones IS which are formed in the epitaxial layer E by means of masked diffusion and/or implantation, in which epitaxial layer E is subdivided in this manner into a plurality of n-conductive islands W, i.e., the desired insulation troughs W, insulated from one another by means of two respective pn junctions Ü. One of these insulation troughs W is intended to receive the lateral transistor LT. This is illustrated in FIG. 1. It contains a buried layer zone BZ.

In the example, the lateral transistor LT is designed rotational-symmetrical. Its center is formed by the emitter zone EZ of the p-type which is equidistantly surrounded at a small interval by the annularly designed p-conductive collector zone KZ. An annular n+-doped protective zone SZ is introduced into the collector zone KZ in such manner that it proceeds concentrically to the collector zone KZ and to the emitter zone SZ of the lateral transistor LT. Thereby, for reasons of optimizing the layout, it lies closer to the inner than to the outer edge of the collector zone KZ. The buried layer zone BZ extends at least up to the outer edge of the collector zone KZ or, respectively, the base contact zone BK of the lateral transistor LT.

In the embodiment illustrated in FIG. 1, the lateral transistor LT is designed as a pnp transistor so that the n-conductive insulation trough W is provided as the base of this transistor. The pn junction Ü surrounding the n-conductive insulation trough W including the buried layer zone BZ is reverse biased during operation of the integrated circuit by means of corresponding dimension of the emitter potential, the base potential and the collector potential.

In accord with the design of the lateral transistor LT as a pnp transistor, a p-conductive emitter zone EZ and a p-conductive collector zone KZ are created next to one another within the insulation trough W by means of masked diffusion and/or implantation, as already explained above. The n+-doped protective zone SZ introduced into the collector zone KZ is expediently manufactured simultaneously with the base contacting zone BK serving for the contacting of the base zone BZ of the lateral transistor LT, which base contacting zone BK is likewise n+-doped in consideration of the use of aluminum contacts for the emitter electrode EE, the base electrode BE and the collector electrode KE. The collector electrode KE of the lateral transistor LT extends barrier-free over the surface of the n+-doped protective zone SZ. For the rest, the semiconductor surface is covered by an insulating protective layer O consisting, particularly, of silicon dioxide, as is standard.

The circuit-technical equivalent of the arrangement illustrated in FIG. 1 is shown in FIG. 2, whereby KE, EE, BE indicate the collector, the emitter and the base electrode of the lateral transistor arrangement illustrated in FIG. 1. In addition, the substrate contact SA already indicated in FIG. 1 is illustrated. According to the equivalent circuit diagram, the pnp lateral transistor LT is coupled with a parasitic pnp transistor B whose collector, however, lies at the substrate contact SA. The parasitic transistor B arises because the minority carriers injected vertically by the emitter EZ also arrive in the substrate S via the pn junction Ü as does the current $J_{EV}$ already mentioned above and they generate a collector current there. In saturation operation of the lateral transistor LT, the parasitic pnp transistor D is activated and the main goal of this invention is to weaken this.

The protective zone SZ serves as the collector of an inverse npn vertical transistor C whose emitter is given by the base zone BZ of the lateral transistor LT, whereas the collector of the lateral transistor forms the base of the transistor C. In accord with the design of the collector contact KE of the lateral transistor LT specified above, the collector of the npn vertical transistor C is connected with the base of this transistor.

For the simultaneous suppression of the parasitic pnp transistor B from the emitter to the substrate, it is to be recommended that the collector zone KZ be advanced somewhat deeper than usual in the area of the protective zone SZ into the interior of the semiconductor crystal. To this end, upon suitable selection of the activators doping the collector zone KZ and the protective zone SZ, one can exploit the so-called emitter-dip-effect which, for example, can be achieved upon employment of silicon as the semiconductor material as well as employment of boron as doping for the p-doped and of phosphorus as doping for the n and n+ areas and upon sufficient proximity of the pn junctions respectively delimiting the zones KZ and SZ.

During operation of the integrated circuit, the collector electrode KE of the lateral transistor LT lies at a collector operating potential $V_C$, the base BZ lies at a base potential $V_B$, the emitter EZ lies at an emitter potential $V_E$ and the substrate S with its terminal SA lies at a substrate potential $V_S$. Thereby, the signals driving the transistor LT can be superimposed either on the emitter potential or on the base potential. The potentials $V_s$ and $V_B$ must be attuned to one another in such manner that—at least during normal operation of the integrated circuit—the pn junction Ü limiting the base zone BZ towards the outside is always reverse biased. In the case illustrated in FIG. 1, this means that the substrate S should also remain negatively biased with respect to the base BZ of the lateral transistor LT even when the signals driving the transistor LT in conjunction with the remaining elements of the integrated circuit are supplied via the base electrode BE of the lateral transistor LT.

The usual measures for weakening a substrate current in general use today can also be employed in addition to the described embodiment of the lateral transistor LT with a protective zone SZ introduced into its collector. They are for example, (a) a metallic annular contact SE at the substrate S around the area W incorporating the lateral transistor LT which is as complete as possible, (b) shielding electrodes in the form of annular p, p+ and n+-doped zones, and (c) enlargement of the distance between the collector KZ and the pn junction Ü delimiting the base zone BZ.

These measures, however, exhibit specific disadvantages such as, for example, great space requirements, danger of creation of thyristors as well as an increase of surface problems which are avoided in the employment of this invention.

Although the invention has been described with respect to preferred embodiments, it is not to be so limited as changes and modifications can be made which are within the full intended scope of the invention as defined by the appended claims.

I claim as my invention:

1. In a monolithic integrated circuit, the combination comprising a substrate of semiconductor material, an epitaxial layer of one conductivity type on one major surface of said substrate, said substrate being of a second conductivity type, a buried layer of said one conductivity type formed partially in said epitaxial layer and partially in said substrate, a lateral transistor in said epitaxial layer which includes an emitter zone of said second conductivity type above said buried layer, a base zone of said first conductivity type abutting said emitter zone, said base zone also located above said buried emitter zone, and a collector zone abutting said base zone, said emitter, base and collector zones forming said lateral transistor, a protective zone of said first conductivity type formed in said collector zone of said lateral transistor and displaced from the center of said collector zone in the direction toward said emitter zone and which protective zone serves as the collector of an inverse vertical transistor whose emitter is provided by said buried layer, base, emitter and collector electrodes with said collector electrode making electrical contact with said collector zone and said protective zone.

2. A circuit according to claim 1 in which said base zone is concentrically located about said emitter zone.

3. A circuit according to claim 2 in which said collector zone is concentrically located about said base zone.

4. A circuit according to claim 1 in which said protective zone is formed of a material having a higher conductivity than that of said epitaxial layer.

5. A monolithically integrated semiconductor circuit device having at least one lateral transistor formed in a semiconductor crystal, said transistor having a base zone of one conductivity type and an emitter and a collector zone of a second conductivity type, said base zone being delimited from its environment in said crystal by means of a pn junction reverse biased via a d.c. voltage, an additional zone in said crystal of the same conductivity type as said base zone formed in part of said collector zone adjacent the surface of said crystal and displaced from the center of said collector zone in the direction toward said emitter zone and electrodes making ohmic contacts for said emitter, base and collector zones, said additional zone being contacted barrier-free by the same electrode as the one which contacts said collector zone.

6. A semiconductor circuit device according to claim 5 in which the specific conductivity of said additional zone is higher than that of said base zone in the area between said emitter and said collector of said lateral transistor.

7. An integrated semiconductor circuit arrangement comprising monocrystalline semiconductor slice of p-type conductivity, a lateral transistor formed in a surface of said slice which is rotational-symmetrical, said lateral transistor having a base zone of said one conductivity type, and having emitter and collector zones of the opposite conductivity type providing an emitter zone, said emitter zone being equidistantly surrounded at a small interval annularly by said collector zone, an annular highly doped additional zone of said one conductivity type in said collector zone and displaced from the center of said collector zone in the direction toward said emitter zone and emitter, collector and base electrodes on said surface contacting said emitter, collector and base respectively, said collector electrode also contacting said additional zone.

8. A monolithically integrated semiconductor circuit comprising a semiconductor layer of one conductivity type, at least one lateral transistor in said layer being delimited from its environment in said crystal by means of a pn junction reverse biased by a d.c. voltage, said crystal having an additional zone of the same conductivity type as said base zone formed within said collector zone of said lateral transistor and displaced from the center of said collector zone in the direction toward said emitter zone and an electrode contacting said collector zone of said lateral transistor and said additional zone in a barrier-free manner.

9. An integrated semiconductor circuit according to claim 8 in which the specific conductivity of said base zone of said lateral transistor is higher in the area under said emitter, base and collector than in the area between said emitter and said collector of said lateral transistor.

10. Device according to claim 7, in which said collector zone and said emitter zone of said lateral transistor are manufactured in a common doping process.

11. Device according to claim 7, in which said additional zone of the conductivity type of said base zone of said lateral transistor introduced into the collector zone of said lateral transistor is manufactured in a common doping process together with the contacting zone producing the base contact.

12. A monolithically integrated semiconductor circuit device having at least one lateral transistor formed in a semiconductor crystal, said transistor having a base zone of one conductivity type and an emitter and a collector zone of a second conductivity type, said base zone being delimited from its environment in said crystal by means of a pn junction reverse biased via a d.c. voltage, an additional zone in the crystal of the same conductivity type as said base zone formed in part of said collector zone adjacent the surface of said crystal, electrodes making ohmic contacts for said emitter, base and collector zones, said additional zone being contacted barrier-free by the same electrode as the one which contacts said collector zone, the specific conductivity of said additional zone being higher than that of said base zone in the area between said emitter and said collector of said lateral transistor, the distance between said additional zone introduced into said collector zone of said lateral transistor being smaller at the side lying opposite said emitter than at the side lying opposite said pn junction limiting said base zone of said lateral transistor toward the outside.

* * * * *